(12) United States Patent
Beckman et al.

(10) Patent No.: US 7,264,507 B2
(45) Date of Patent: Sep. 4, 2007

(54) SCREEN CONNECTOR DEVICE FOR A CIRCUIT BOARD MOUNTED WITHIN A HOUSING

(75) Inventors: Ralf Beckman, Detmold (DE); Markus Lohr, Nieheim (DE); Jurgen Feye-Hohmann, Detmold (DE); Jens-Uwe Henkel, Detmold (DE)

(73) Assignee: Phoenix Contact GmbH & Co. KG (DE)

( * ) Notice: Subject to any disclaimer, the term of this patent is extended or adjusted under 35 U.S.C. 154(b) by 0 days.

(21) Appl. No.: 10/968,000

(22) Filed: Oct. 19, 2004

(65) Prior Publication Data

US 2005/0090150 A1    Apr. 28, 2005

(51) Int. Cl.
*H01R 13/648* (2006.01)
(52) U.S. Cl. ...................... 439/607; 439/564
(58) Field of Classification Search ............... 439/607, 439/609, 108, 564, 569, 572, 573, 939
See application file for complete search history.

(56) References Cited

U.S. PATENT DOCUMENTS

| 3,601,430 | A | | 8/1971 | Zwennis | |
| 5,709,569 | A | * | 1/1998 | Buck et al. | 439/607 |
| 6,059,606 | A | * | 5/2000 | Okuyama et al. | 439/607 |
| 6,066,001 | A | * | 5/2000 | Liptak et al. | 439/607 |
| 6,126,485 | A | * | 10/2000 | Shobara et al. | 439/607 |
| 6,241,555 | B1 | * | 6/2001 | Okuyama et al. | 439/607 |
| 6,364,706 | B1 | * | 4/2002 | Ando et al. | 439/607 |
| 6,736,676 | B2 | * | 5/2004 | Zhang et al. | 439/607 |
| 6,755,686 | B2 | * | 6/2004 | Scherer et al. | 439/564 |

FOREIGN PATENT DOCUMENTS

| DE | 1813598 | 7/1969 |
| DE | 8324091 | 2/1984 |

* cited by examiner

*Primary Examiner*—Hien Vu
(74) *Attorney, Agent, or Firm*—Bourque and Associates

(57) ABSTRACT

A screening connection device for a circuit board mounted within a housing possesses a plug component attached to the exterior of a housing wall by means of securing screws that may be coupled to a socket component mounted to the interior of the housing wall through a cutout in the wall. The plug component includes a screening connection in electrical contact with the securing screws to connect the shield of a cable connected to the plug component whose electrical lines may be connected to the circuit board via the plug component and the socket component. In order to provide contact elements between the securing screws of the plug component and the conductor on the circuit board provided to conduct the screen potential that are simple to manufacture, that provide positive contact, and that are robust components, screening plates are mountable so that they are fixed to the circuit board so that at least one conductor for connection of the screen potential may be brought into contact. Each of these screening plates includes a securing flange that rests against the interior side of the housing wall, and a threaded socket to engage one of the securing screws of the plug component.

8 Claims, 3 Drawing Sheets

SCREEN CONNECTOR DEVICE FOR A CIRCUIT BOARD MOUNTED WITHIN A HOUSING

TECHNICAL FIELD

The invention relates to a connector device for a circuit board.

BACKGROUND INFORMATION

The invention relates to a screen connector device for a circuit board mounted within a housing with a plug component attached to the exterior of a housing wall by means of securing screws that may be coupled to a socket component mounted to the interior of the housing wall through a cutout in the wall, and that the plug component includes a screening connection in electrical contact with the securing screws to connect the shield of a cable connected to the plug component whose electrical lines may be connected to the circuit board via the plug component and the socket component.

In a known embodiment of such a screen connector device, transfer of the screen potential to the applicable conductor of the circuit board is accomplished via the metallic housing of the plug component and of the socket component. The securing screws to secure the plug component to the pertinent housing wall hereby engage in threaded sockets that are a part of a housing wall made of metal that is not yet in direct electrically-conducting contact with the conductor of the circuit board conducting the screen potential. Special auxiliary devices must resultantly be provided for contact by this conductor of the circuit board in order to connect it with the cable screen of the cable connected to the plug component.

SUMMARY

The goal of this invention is to provide contact elements for a screen connector device of the above mentioned type between the securing screws of the plug component and the conductor provided on the circuit board to guide the screen potential so that it is simple to manufacture, provides positive contact, and is a robust component.

This goal is achieved in a screen connector device of the abovementioned type based on the invention by screen plates that may be firmly attached to the circuit board and that may be brought into contact with at least one of the conductors for connection of the screen potential, each of which includes a securing flange that rests against the interior side of the housing wall, and a threaded socket to engage one of the securing screws of the plug component.

The screening plates based on the invention may be simply produced as simple stamped parts. Even the insertion or cutting of the threaded socket in the securing flange requires no great expense. Extending the screen plates over the securing flange to the pertinent housing wall by means of the securing screws of the plug component ensures good attachment and vibration-proof contact to transfer the screen potential from the plug component to a particular screen plate, or in the reverse direction. The contact is just as positive between a particular screen plate and the pertinent conductor of the circuit board by means of at least one, but preferably two or three pins that may be soldered in place, by means of which the mechanical attachment of the screening plates to the circuit board is ensured.

It is important to note that the present invention is not intended to be limited to a system or method which must satisfy one or more of any stated objects or features of the invention. It is also important to note that the present invention is not limited to the preferred, exemplary, or primary embodiment(s) described herein. Modifications and substitutions by one of ordinary skill in the art are considered to be within the scope of the present invention, which is not to be limited except by the following claims.

BRIEF DESCRIPTION OF THE DRAWINGS

These and other features and advantages of the present invention will be better understood by reading the following detailed description, taken together with the drawings wherein.

DETAILED DESCRIPTION OF THE PREFERRED EMBODIMENTS

Figure 1:
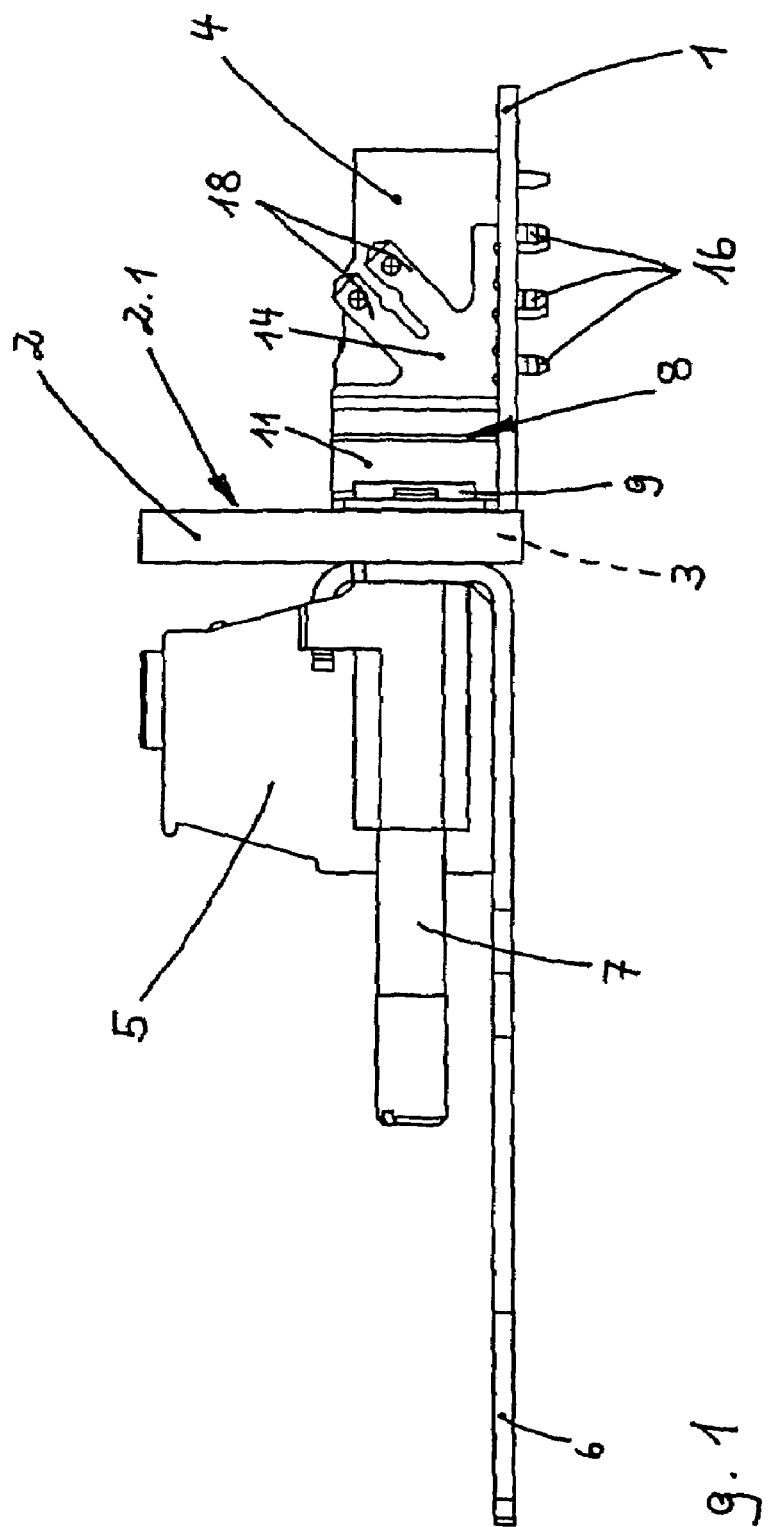
FIG. 1 is a schematic drawing of a plug-connection connector device on a circuit board that is mounted within a housing (partially shown), in lateral view, according to the present invention.
Figure 2:
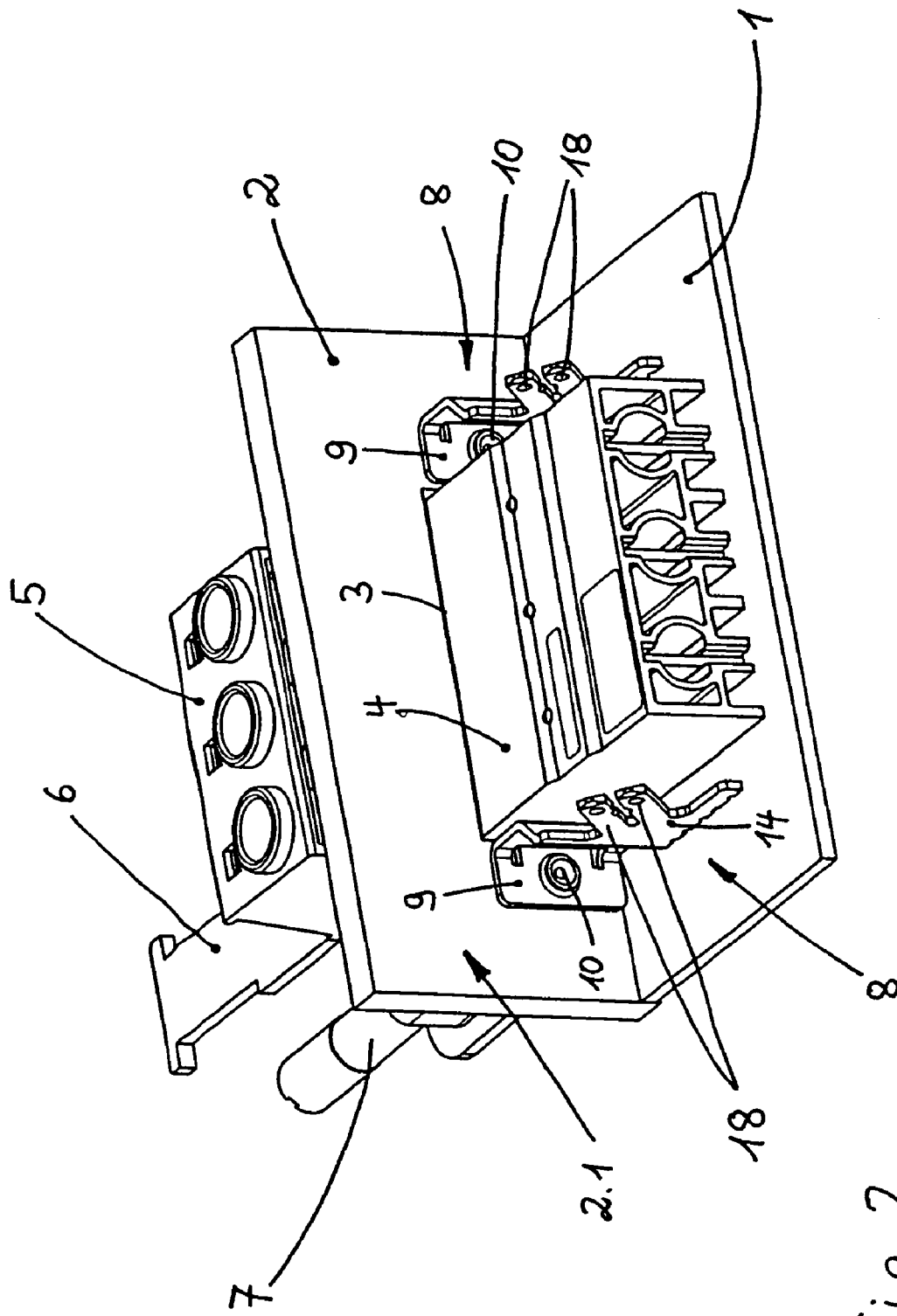
FIG. 2 is a schematic drawing illustrating a perspective view of the plug-connection connector device per FIG. 1 seen from the housing interior side looking out.

Individually, FIGS. 1 and 2 show schematically a circuit board 1 that is adjacent to a housing wall at a right angle. An opening 3 exists in the housing wall 2 through which a socket component 4 positioned within the housing interior and a plug component 5 may be plugged together. The plug component 5 is connected to a cable not shown in the illustration whose electrical connectors may be connected to the pertinent terminals of the circuit board 1 via the plug component 5 and the socket component 4. This type of cable includes a cable screen that is connected both electrically and mechanically to a screen connector 6 on the plug component 5. Attachment of the plug component 5 to the socket component 4 is by means of securing screws 7 that are in electrical contact with the screen connector 6.

Screening plates 8 are located at both sides of the socket component 4 whereby the screen plate 8 positioned to the left on the socket component 4 per FIG. 2 and the screen plate 8 positioned to the right on the socket component 4 are identical. First, both screen plates 8 rest firmly on the circuit board 1, and second, when in installed position, they are firmly tensioned against the interior side 2.1 of the housing wall 2. For this, each of the screen plates 8 includes a securing flange 9 into which a threaded socket 10 is cut, pressed, or inserted. This threaded socket 10 is intended for engagement of the securing screws 7 to the plug component 5.

Figure 3:
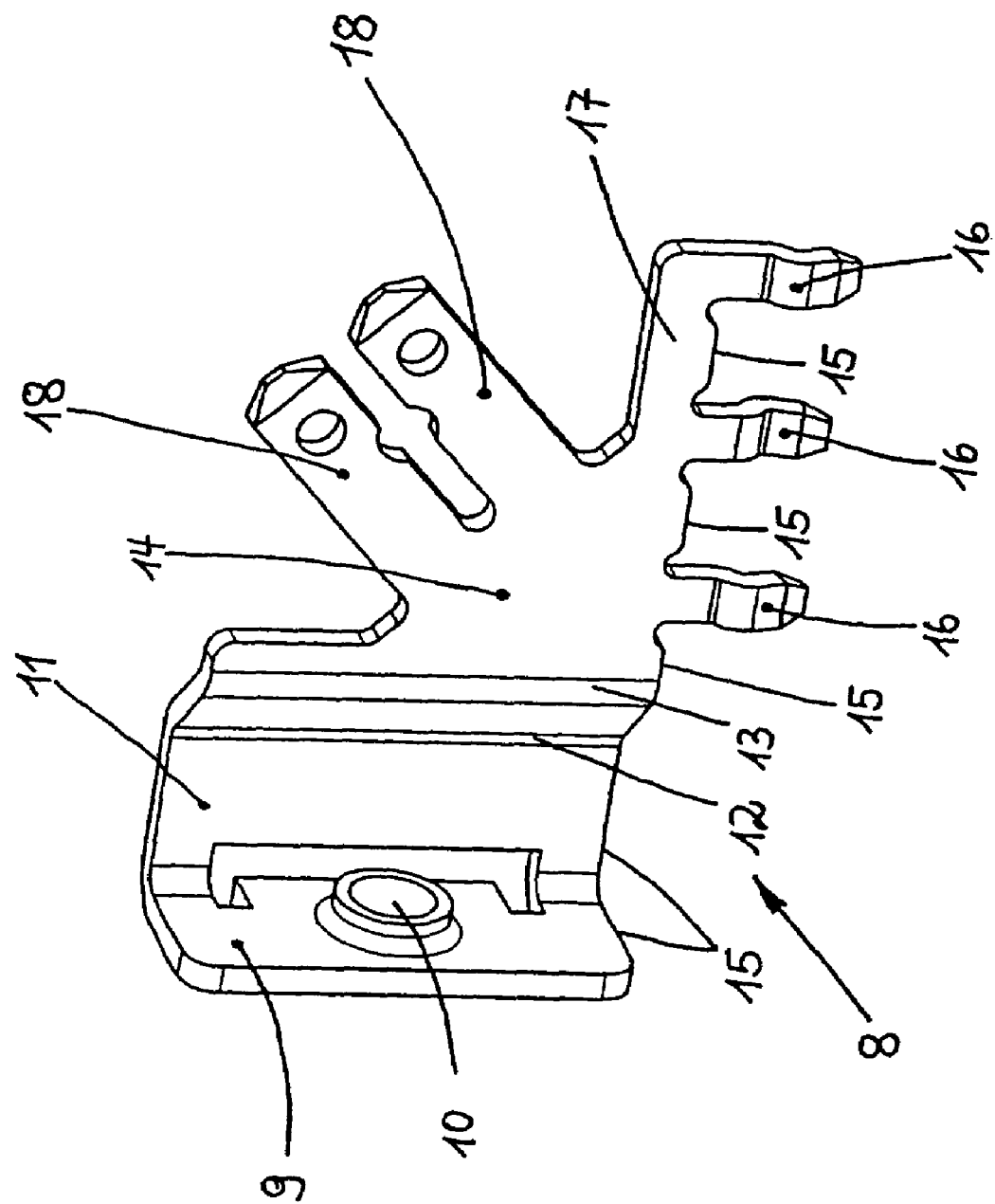
FIG. 3 is a perspective view of the screening plate of the screening plate plug-connection connector device for a plug-connector connection device per FIGS. 1 and 2.

FIG. 3 shows the details of such a screen plate 8. A flat spar 11 connects at a right angle to its securing flange 9 by means of the threaded socket 10 that transforms into a plate-shaped terminal part 14 at a first crimping 12 and a second crimping 13. This plate-shaped terminal part 14 is roughly triangular in shape.

So that the screen plate 8 may be placed firmly onto a circuit board 1, its lower narrow side consists of the securing flange 9, the flat spar 11 and the edges 15 that are a continuation of the plate-shaped terminal part 14 that are all co-planar. The crimpings 12 and 13 between the flat spar 11 and the plate-shaped terminal part 14 are of such type that the plate-shaped terminal part 14 lies parallel to the flat spar 11, and thus also perpendicular to the securing flange 9. Thus, the plane of the plate-shaped terminal part 14 is aligned with the thread axis of the threaded socket 10.

Soldering pins 16 are formed on the plate-shaped terminal part 14 that project over its lower edges 15 that are parallel with one another and extend basically in the direction of the plane of the plate-shaped terminal part 14. The soldering pins project over the lower edges 15 of the plate-shaped terminal part 14 perpendicularly, whereby only one of the three available soldering pins 16 is adjacent to the basically triangular plate-shaped terminal part 14. The other two soldering pins 16 rest on an arm 17 that extends as an continuation of one of the triangle sides of the terminal part 14 away from the securing flange 9. Two other flat spade lugs 18 that are parallel to each other and that project in a direction away from the terminal part 14 and that point away from the soldering pins 16, namely upward, connect to the central terminal part 14.

The circuit board 1 (FIGS. 1 and 2) includes holes that correspond to the configuration of the soldering pins 16 into which the soldering pins 16 may be inserted, establishing via soldering both an electrical and a mechanical connection. The special configuration of the central plate-shaped terminal part 14 relative to the securing flange 9 and the threaded socket 10 makes it possible to use one model of screening plate 8 on either the right or the left sides of the socket component, or of the plug component, so that two different, mirror-reflected embodiments result.

As mentioned above, the present invention is not intended to be limited to a system or method which must satisfy one or more of any stated or implied object or feature of the invention and should not be limited to the preferred, exemplary, or primary embodiment(s) described herein. The foregoing description of a preferred embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as is suited to the particular use contemplated. All such modifications and variations are within the scope of the invention as determined by the claims when interpreted in accordance with the breadth to which they are fairly, legally and equitably entitled.

The invention claimed is:

1. A screen connector or device for a circuit board mounted within a housing with a plug component attached to a exterior of a housing wall by means of securing screws that are coupled to a socket component mounted to a interior of the housing wall through a cutout in the wall, and the plug component includes a screening connection in electrical contact with the securing screws to connect a shield of a cable connected to the plug component with electrical lines connected to the circuit board via the plug component and the socket component, characterized by:

at least one screen plate that are firmly attached to the circuit board and that is brought into contact with at least one conductors for connection of a screen potential of the screen plate, each of which includes a securing flange that rests against the interior side of the housing wall, a threaded socket to engage one of the securing screws of the plug component, a flat spar coupled generally perpendicular to the securing flange and at generally the same height to the securing flange, and a terminal part coupled to the flat spar and arranged generally parallel and adjacent to a plane of the flat spar and aligned with a longitudinal axis of the threaded socket.

2. A screen connector device as in claim 1, wherein each of the screen plates including a connection terminal perpendicular to the securing flange and having at least one soldering pin extending in a lonqitudial plane of the screen plate.

3. A screen connector device as in claim 2, wherein two or more soldering pins are present on the connection terminal of the screening plates that are arranged parallel to one another.

4. A screen connector device as in claim 1, wherein at least one soldering pin extends perpendicular to a longitudinal axis direction of the threaded socket in the securing flange of the at least one screening plate.

5. A screen connector device as in claim 1, wherein at least one flat spade lug is formed on the terminal part that project in a direction away from the terminal part and that point away from at least one soldering pin.

6. A screen connector device as in claim 1, wherein the terminal part provides a flat spar parallel to a longitudinal axis of the threaded socket at first and second angled crimpings that couple to the securing flange of the at least one screening plate.

7. A screen connector device as in claim 1, wherein the terminal part, the flat spar, and the securing flange also possess at least one soldering pin to set onto the circuit board that are co-planar, whereby at least one soldering pin projects downward, beyond a bottom edge of the screen connector.

8. A screen connector device for a circuit board mounted within a housing comprising:

at least one screen plate coupling a circuit board to a frame and providing a conductor of a screen potential of the screen plate wherein each screen plate consists essentially of a securing flange that rests against a housing wall, a threaded socket to engage a securing screw of a plug component, a flat spar coupled generally perpendicular to the securing flange, a terminal part coupled to the flat spur and aligned with a longitudinal axis of the threaded socket, and at least one soldering pin extending downward in a longitudinal plane of the screen plate.

* * * * *